United States Patent
Gamota et al.

[11] Patent Number: 5,844,319
[45] Date of Patent: Dec. 1, 1998

[54] MICROELECTRONIC ASSEMBLY WITH COLLAR SURROUNDING INTEGRATED CIRCUIT COMPONENT ON A SUBSTRATE

[75] Inventors: Danniel Roman Gamota, Palatine; George Amos Carson, Elk Grove Village; Sean Xin Wu, Palatine; Brian J. Bullock, Elmhurst, all of Ill.

[73] Assignee: Motorola Corporation, Schaumburg, Ill.

[21] Appl. No.: 808,773

[22] Filed: Mar. 3, 1997

[51] Int. Cl.[6] .......................... H01L 23/48; H01L 23/52; H01L 29/40
[52] U.S. Cl. .......................... 257/778; 257/103; 257/705; 257/668; 257/783; 257/667
[58] Field of Search ..................... 257/778, 730, 257/731, 700, 703, 705, 668, 792, 796, 732, 738, 667, 783; 438/613, 108; 228/180.22

[56] References Cited

U.S. PATENT DOCUMENTS

| | | | |
|---|---|---|---|
| 4,664,309 | 5/1987 | Allen et al. | 257/774 |
| 4,691,225 | 9/1987 | Murakami et al. | 257/668 |
| 5,089,440 | 2/1992 | Christie et al. | 437/209 |
| 5,120,678 | 6/1992 | Moore et al. | 437/183 |
| 5,218,234 | 6/1993 | Thompson et al. | 257/787 |
| 5,220,200 | 6/1993 | Blanton | 257/778 |
| 5,313,365 | 5/1994 | Pennisi et al. | 257/788 |
| 5,386,432 | 1/1995 | Rostoker | 257/668 |

FOREIGN PATENT DOCUMENTS 63-239826  5/1988  Japan .

OTHER PUBLICATIONS

"Electronic Packaging and Interconnection Handbook", pp. 1.58, 1.59, 1.16, Harper, Nov. 1992.
"Electronic Packaging & Interconnection Handbook" pp. 732–734.

Primary Examiner—Mahshid D. Saadat
Assistant Examiner—Jhihan B. Clark
Attorney, Agent, or Firm—Douglas D. Fekete; John McIntyre

[57] ABSTRACT

A microelectronic assembly (10) includes an integrated circuit component (14) attached to a polymeric substrate (12) by a plurality of unencapsulated solder bump interconnections (16). A collar (18) is affixed to the polymeric substrate (12) about the integrated circuit component (14) and is formed of an inorganic material having a coefficient of thermal expansion less than that of the substrate (12). The collar (18) constrains thermal expansion of the polymeric substrate (12) in the die attach region (22), thereby lessening any deleterious effects caused by a mismatch in the thermal expansion of the polymeric substrate (12) and the integrated circuit component (14).

11 Claims, 1 Drawing Sheet

MICROELECTRONIC ASSEMBLY WITH COLLAR SURROUNDING INTEGRATED CIRCUIT COMPONENT ON A SUBSTRATE

FIELD OF THE INVENTION

This invention relates generally to a microelectronic assembly that includes an integrated circuit component mounted to a polymeric substrate. More particularly, this invention relates to such an assembly wherein a collar is affixed to the polymeric substrate about the integrated circuit component to constrain expansion and contraction of the polymeric substrate.

BACKGROUND OF THE INVENTION

Integrated circuit components are mounted to substrates, such as printed circuit boards, to send and receive signals between the component and the substrate. The connections are typically formed by solder bump interconnections that both electrically and mechanically attach the integrated circuit component to the substrate.

Integrated circuit components are typically formed of silicon and have a coefficient of thermal expansion of about 3–4 ppm/°C. Printed circuit boards typically have a higher coefficient of thermal expansion than the integrated circuit component, often in the 12–30 ppm/°C. range.

When forming the solder bump interconnections, the assembly is typically heated to a temperature sufficient to reflow the solder alloy to connect the integrated circuit component to the substrate. During the heating and subsequent cooling of the assembly, the component and the substrate expand and contract. The extent of the expansion and contraction is determined by the coefficient of thermal expansion (CTE) of the element. The higher the CTE, the greater the expansion and contraction.

Since a typical integrated circuit component has a lower CTE than the substrate to which it is attached, the component expands and contracts much less than the substrate. Consequently, stresses are formed in the assembly. Theses stresses can cause cracking of solder bump interconnections, delamination of solder bump interconnections from the bond pads on the component, and other problems that may or may not manifest themselves during testing.

One method proposed to minimize problems resulting from expansion and contraction is to underfill the integrated circuit component with a polymeric encapsulant. The polymeric encapsulant acts to distribute the stresses in the assembly. However, the encapsulant does not actually remove the stresses, but rather transfers them, often to the non-active face of the integrated circuit component opposite the substrate. This may lead to cracking of the non-active face of the die. Further, once the polymeric encapsulant has been cured, the component is difficult to remove and replace if it is found to be defective.

One method proposed to lessen the deleterious effects on the non-active face of the component is to embed a frame into the precursor prior to curing. This was found to greatly reduce the stresses on the nonactive face. However, if the component is found to be defective, the problems with the removal of the encapsulant are still present.

Consequently, a need exists for a method of minimizing the effects of thermal expansion on an assembly. Further, a need exists to form an assembly that does not require an underfilling encapsulant, where the assembly is able to be reworked if the component is found to be defective.

DETAILED DESCRIPTION OF A PREFERRED EMBODIMENT

The present invention provides a microelectronic assembly that is formed by attaching an integrated circuit component to a substrate and bonding a collar about the integrated circuit component. The collar is effective to constrain thermal expansion of the substrate. The substrate is preferably formed of a polymeric material and includes substrate bond pads and a surrounding region about a die attach region. The integrated circuit component overlies the substrate and is spaced apart therefrom by a gap. The component includes an active face that faces the substrate and also includes component bond pads that are disposed at the active face. A plurality of solder bump interconnections extend across the gap to connect a substrate bond pad to a component bond pad. The solder bump interconnections are unencapsulated, thereby simplifying the manufacturing process and allowing rework of the microelectronic assembly. As used herein, unencapsulated refers to solder bump interconnections that are not surrounded by polymeric material.

A collar is bonded to the substrate about the integrated circuit component. The collar is formed of an inorganic material that has a coefficient of thermal expansion less than that of the polymeric substrate, preferably less than about 7 ppm/°C. To enhance reliability of the assembly, the collar is affixed to the substrate to constrain thermal expansion in the die attach region. Affixing the collar to the substrate reduces strain arising from differences in the CTE between the polymeric substrate and the integrated circuit component.

Figure 1:
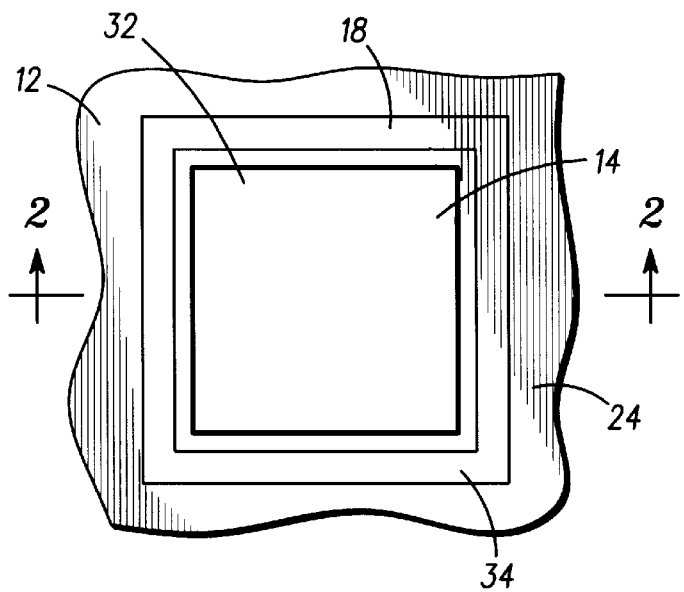
FIG. 1 is a top plan view of a microelectronic assembly that includes an integrated circuit component mounted to a substrate and surrounded by a collar.
Figure 2:
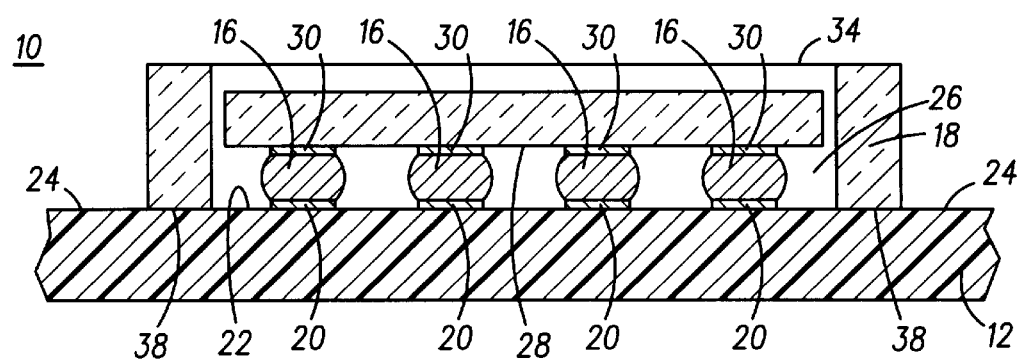
FIG. 2 is a cross-sectional view of the microelectronic assembly in FIG. 1 taken along line 2—2.
Figure 3:
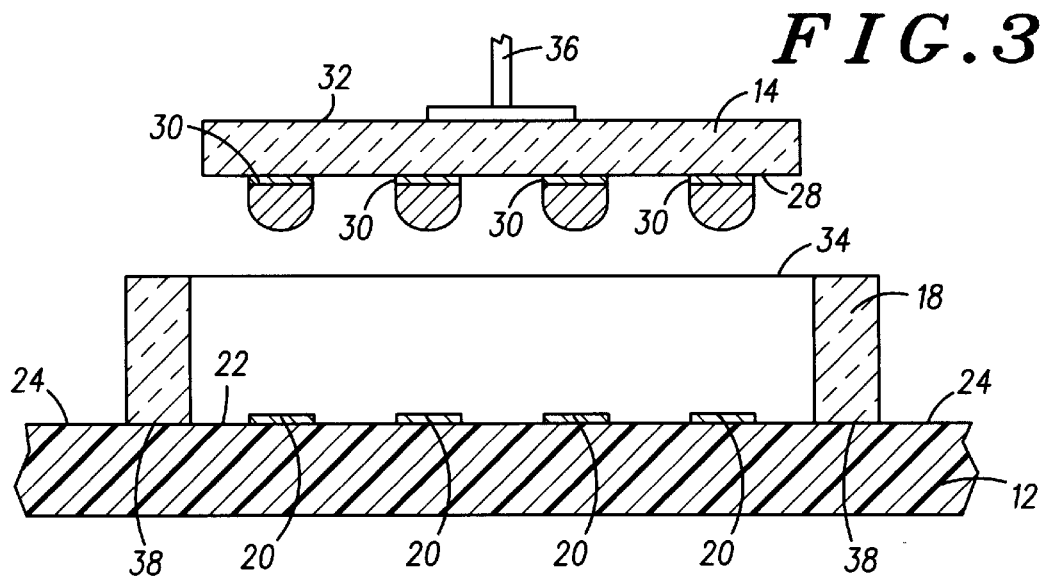
FIG. 3 is a cross-sectional view of a microelectronic assembly after heating to melt the solder bump interconnections to permit removal of the integrated circuit component from the substrate.

The present invention can be better understood with reference to FIGS. 1–3. In accordance with a preferred embodiment of this invention, FIGS. 1 and 2 depict a microelectronic assembly 10 that comprises an integrated circuit component 14 attached to a polymeric substrate 12 by a plurality of solder bump interconnections 16. Polymeric substrate 12 includes substrate bond pads 20 that are preferably coated with a tin-lead solder comprising about 97 weight percent lead and the balance substantially tin. Substrate 12 includes a die attach region 22 about substrate bond pads 20. Die attach region 22 is surrounded by a surrounding region 24.

Substrate 12 is preferably a printed circuit board formed of a glass/epoxy laminate that has a CTE of between about 12 and 25 ppm/°C. A preferred substrate is comprised of a glass/polymer mesh commonly referred to as FR4 and having a CTE of about 16 ppm/°C.

Integrated circuit component 14 is preferably an integrated circuit die formed of silicon and has a CTE of between about 3–4 ppm/°C. In a preferred embodiment, integrated circuit component 14 is generally rectangular. Integrated circuit component 14 includes an active face 28, a non-active face 32 opposite active face 28, and component bond pads 30. Component bond pads 30 are preferably formed of copper and coated with a eutectic tin-lead alloy comprising about 63 weight percent tin and the balance substantially lead and having a melting temperature of about 183° C. Integrated circuit component 14 is superposed onto polymeric substrate 12, such that integrated circuit component 14 overlies substrate 12 at die attach region 22 and each substrate bond pad 20 registers with a component bond pad 30.

Collar 18 is placed onto substrate 12 about integrated circuit component 14. In a preferred embodiment, collar 18 is generally rectangular and is attached in close proximity to component 14, preferably within 500 microns, and most preferably within 250 microns. Collar 18 is separated from component 14 by an air gap. Collar 18 preferably includes an adhesive material on bottom surface 38 to mechanically couple collar 18 to substrate 12. Collar 18 is formed of an inorganic material that is effective to constrain the expansion and contraction of substrate 12 within die attach region 22 during thermal cycling. Such expansion and contraction is common during reflow, testing, and usage. Collar 18 has a coefficient of thermal expansion less than that of substrate 12 and preferably near that of component 14. In a preferred embodiment, collar 18 has a CTE of less than about 7 ppm/°C.

Collar 18 is preferably a frame formed of a ceramic material, such as alumina or silica, having a coefficient of thermal expansion of about 7 ppm/°C. Alternatively, collar 18 may be formed of "INVAR", which has a coefficient of thermal expansion of near 0 ppm/°C. Collar 18 is preferably adhesively bonded to substrate 12, but may alternately be attached by other means, such as by including posts extending from collar 18 that extend through holes formed in substrate 12.

Substrate 12, component 14, and collar 18 are heated to a temperature sufficient to reflow the eutectic solder formed on component bond pads 30. Thereafter the arrangement is cooled to form solder bump interconnections 16 that attach substrate bond pads 20 to component bond pads 30. During the reflow process, the adhesive material located on bottom surface 38 is cured to mechanically couple collar 38 to substrate 12 about die attach region 22.

Gap 26 is thereby formed between active face 28 and substrate 12. Solder bump interconnections 16 extend across gap 26. Solder bump interconnections 16 electrically and mechanically attach substrate bond pads 20 and component bond pads 30. Gap 26 is an air gap characterized by having no material, such as a polymeric underfill, therein.

Non-active face 32 is spaced apart from substrate 12 by a first distance. Collar 18 includes a top surface 34 that when attached to substrate 12 is spaced apart from substrate 12 by a second distance greater than the first distance. In this manner, collar 18 extends above non-active face 32 to protect non-active face 32 from damaging environmental consequences, such as scratching and bumping that can occur during manufacture, testing, and use.

FIG. 3 depicts the removal of integrated circuit component 14 from substrate 12. Integrated circuit component 14 may be removed from substrate 12 if component 14 is found to be defective or if component 14 is desired to be placed onto another substrate. To remove component 14, the assembly is heated above the temperature of solder bump interconnections 16. After reaching the liquidus temperature of solder bump interconnections 16, an end effector 36 engages non-active face 32 of component 14. End effector 36 is preferably a vacuum head that provides a vacuum force on non-active face 32 and lifts component 14 away from substrate 12. In this manner, a different integrated circuit component can be attached to the die attach region. Because collar 18 provides enhanced support and eliminates the need for an underfilling encapsulant, there is no need to remove any polymeric underfill. Consequently, the removal of a component, such as for upgrading or for component defect, is made much easier and more reliable.

Thus, the present invention provides a microelectronic assembly that includes an integrated circuit component mounted to a polymeric substrate by a plurality of unencapsulated solder bump interconnections. A collar is attached to the substrate about the integrated circuit component. The collar preferably has a coefficient of thermal expansion that is near that of the integrated circuit component and less than that of the polymeric substrate. In this manner, the collar acts to constrain expansion and contraction of the substrate during heating and cooling, as commonly occurs during manufacture, testing, and ordinary usage. This makes the microelectronic assembly more reliable by lessening the stress places on the integrated circuit component, and particularly as is found on the back side of the component. The collar, by having a height greater than that of the attached component, also serves to protect the non-active face of the component from physical damage.

Further, a microelectronic assembly is formed that is easily reworkable. Because the collar provides enhanced mechanical support, there is no need for a polymeric underfill. This underfill is typically difficult to remove if the component needs to be replaced. The present invention removes the need for an underfilling encapsulant by limiting the expansion and contraction of the substrate by attaching a collar to the substrate.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A microelectronic assembly comprising:
   a polymeric substrate comprising a plurality of substrate bond pads, a die attach region, and a surrounding region about the die attach region;
   an integrated circuit component overlying the polymeric substrate and spaced apart therefrom by a gap, said integrated circuit component comprising an active face facing the polymeric substrate and a plurality of component bond pads disposed at the active face;
   a plurality of unencapsulated solder bump interconnections extending across the gap, each solder bump interconnection connecting a substrate bond pad and a component bond pad; and
   a collar bonded to the polymeric substrate about a perimeter of the integrated circuit component, said collar formed of an inorganic material having a coefficient of thermal expansion less than the polymeric substrate to constrain thermal expansion of the die attach region.

2. A microelectronic assembly in accordance with claim 1, wherein the collar is formed of a ceramic material.

3. A microelectronic assembly in accordance with claim 1, wherein the collar is adhesively bonded to the polymeric substrate.

4. A microelectronic assembly in accordance with claim 1, wherein the integrated circuit component further comprises a non-active face opposite the active face and spaced apart from the polymeric substrate by a first height, and wherein the collar comprises a top surface spaced from the polymeric substrate by a second height greater than the first height.

5. A microelectronic assembly comprising:
   a printed circuit board comprising a plurality of substrate bond pads, a die attach region, and a surrounding region about the die attach region;
   an integrated circuit component overlying the printed circuit board and spaced apart therefrom by a gap, said integrated circuit component comprising an active face facing the printed circuit board and a plurality of component bond pads disposed at the active face;

a plurality of unencapsulated solder bump interconnections extending across the gap, each solder bump interconnection connecting a substrate bond pad and a component bond pad; and a collar bonded to the printed circuit board about the integrated circuit component and spaced apart from the integrated circuit component by an air gap, said collar formed of a ceramic material having a coefficient of thermal expansion less than 7 ppm/°C. and affixed to the printed circuit board to constrain thermal expansion in the die attach region.

6. A microelectronic assembly in accordance with claim 5, wherein the collar is formed of alumina.

7. A microelectronic assembly in accordance with claim 5, wherein the collar is formed of silica.

8. A microelectronic assembly in accordance with claim 5, wherein the collar is spaced apart from the integrated circuit component by less than 500 microns.

9. A microelectronic assembly in accordance with claim 5, wherein the collar is spaced apart from the integrated circuit component by less than 250 microns.

10. A microelectronic assembly in accordance with claim 5, wherein the printed circuit board is formed of a glass-epoxy laminate.

11. A microelectronic assembly comprising:

a printed circuit board comprising a plurality of substrate bond pads, a die attach region, and a surrounding region about the die attach region;

an integrated circuit component overlying the printed circuit board and spaced apart therefrom by a gap, said integrated circuit component comprising an active face facing the printed circuit board and a plurality of component bond pads disposed at the active face, said integrated circuit component being generally rectangular;

a plurality of unencapsulated solder bump interconnections extending across the gap, each solder bump interconnection connecting a substrate bond pad and a component bond pad; and a collar bonded to the printed circuit board about the integrated circuit component and spaced apart from the integrated circuit component by an air gap, said collar being generally rectangular and formed of a ceramic material having a coefficient of thermal expansion less than 7 ppm/°C. and affixed to the printed circuit board to constrain thermal expansion in the die attach region.

* * * * *